(12) United States Patent
Perrin et al.

(10) Patent No.: US 6,254,457 B1
(45) Date of Patent: Jul. 3, 2001

(54) PROCESS FOR POLISHING WAFERS OF INTEGRATED CIRCUITS

(75) Inventors: Emmanuel Perrin, Biviers; Frédéric Robert, Ambares; Henri Banvillet, Froges; Luc Liauzu, Grenoble, all of (FR)

(73) Assignee: STMicroelectronics, S.A., Gentilly (FR)

( * ) Notice: Subject to any disclaimer, the term of this patent is extended or adjusted under 35 U.S.C. 154(b) by 0 days.

(21) Appl. No.: 09/344,155

(22) Filed: Jun. 24, 1999

(30) Foreign Application Priority Data

Jun. 26, 1998 (FR) .................................................. 98 08152

(51) Int. Cl.$^7$ ..................................................... B24B 1/00
(52) U.S. Cl. .................................. 451/41; 451/5; 451/6; 451/8
(58) Field of Search ............................ 451/41, 288, 287, 451/443, 21, 6, 5, 8

(56) References Cited

U.S. PATENT DOCUMENTS

| | | | |
|---|---|---|---|
| 5,240,552 | * 8/1993 | Yu et al. | 156/636 |
| 5,433,650 | * 7/1995 | Winebarger | 451/6 |
| 5,552,996 | 9/1996 | Hoffman et al. | |
| 5,618,447 | * 4/1997 | Sandhu | 438/14 |
| 5,655,951 | * 8/1997 | Meikle et al. | 451/56 |
| 5,659,492 | 8/1997 | Li et al. | |
| 5,664,987 | 9/1997 | Renteln | |
| 5,667,629 | * 9/1997 | Pan et al. | 438/13 |
| 5,685,766 | * 11/1997 | Mattingly et al. | 451/36 |
| 5,695,601 | 12/1997 | Kodera et al. | |
| 5,801,066 | * 9/1998 | Meikle | 438/14 |
| 5,812,407 | * 9/1998 | Sato et al. | 364/474.35 |
| 5,830,041 | * 11/1998 | Takahashi et al. | 451/8 |
| 5,851,846 | * 12/1998 | Matsui et al. | 438/17 |
| 5,938,502 | * 8/1999 | Kubo | 451/6 |
| 5,948,203 | * 9/1999 | Wang | 156/345 |
| 5,951,370 | * 9/1999 | Cesna | 451/21 |
| 6,004,196 | * 12/1999 | Doan et al. | 451/443 |
| 6,110,008 | * 8/2000 | Fujita et al. | 451/8 |
| 6,120,348 | * 9/2000 | Fujita et al. | 451/5 |

FOREIGN PATENT DOCUMENTS

| | | |
|---|---|---|
| WO 97/01186 | 1/1997 | (WO) . |
| WO 98/14306 | 4/1998 | (WO) . |

OTHER PUBLICATIONS

French Search Report dated Mar. 8, 1999 with annex on French Application No. 98–08152.

* cited by examiner

Primary Examiner—Lee Young
Assistant Examiner—Minh Trinh
(74) Attorney, Agent, or Firm—Theodore E. Galanthay; Fleit, Kain, Gibbons, Gutman & Bongini P.L.

(57) ABSTRACT

A process for polishing, on a polishing machine and under defined polishing conditions, the external surface of at least one wafer of integrated circuits comprising a projecting feature covered over the entire surface of the wafer with an external layer of a material, consisting in calculating a main equivalent thickness equal to the main surface density of the projecting feature multiplied by the thickness of the latter; in polishing, under the defined polishing conditions, a reference wafer comprising an external layer of the material, having a uniform thickness and covering the surface of this reference wafer, so as to determine the rate of removal by the polishing machine corresponding to the ratio of the thickness removed to the polishing time elapsed; in calculating a polishing time equal to the ratio of the aforementioned equivalent thickness to the aforementioned rate of removal; in calculating a total equivalent thickness equal to the sum of the main equivalent thickness and of a complementary thickness of preset value; in calculating a polishing time equal to the ratio of this total-equivalent thickness to the aforementioned rate of removal; and in carrying out, under the polishing conditions, the polishing operation on at least one wafer to be polished for a duration which is equal to the aforementioned polishing time or which depends on this time.

7 Claims, 4 Drawing Sheets

PROCESS FOR POLISHING WAFERS OF INTEGRATED CIRCUITS

CROSS-REFERENCE TO RELATED APPLICATIONS

This application is based upon and claims priority from prior French Patent Application No. 98-08152, filed Jun. 26, 1998, the entire disclosure of which is herein incorporated by reference.

FIELD OF THE INVENTION

The present invention relates to a process for polishing semiconductor wafers of integrated circuits during their fabrication.

BACKGROUND OF THE INVENTION

During the fabrication of integrated circuits on a silicon wafer, projecting features are produced, generally by etching. These are covered over the entire surface of the wafer with a coating of an external layer of a defined material. Next, a chemical-mechanical polishing operation is carried out so as to obtain a planar external surface on which the fabrication of the integrated circuits will continue.

Under particular polishing conditions, it is the polishing time which determines the position at the end of polishing of the polished external surface with respect to the subjacent projecting feature.

At the present time, this polishing time is determined, before carrying out the polishing of a batch of normally identical wafers, by experiments or by trial and error, by successively carrying out polishing operations and measurements of the remaining thickness of the covering material. This is what is proposed in particular in patent document EP 0,824,995.

Unfortunately, it turns out that a relatively high proportion of wafers have to be scrapped because the position of the polished external surface with respect to the subjacent projecting feature is outside preset limits.

Thus there is a need for a polishing process which would make it possible to improve the way the polished external surface is positioned with respect to the subjacent feature and consequently to reduce the proportion of wafers which do not satisfy the desired dimensional characteristics.

SUMMARY OF THE INVENTION

A process for polishing, on a polishing machine and under defined polishing conditions, the external surface of at least one wafer of integrated circuits comprising at least one projecting feature covered over the entire surface of the wafer with an external layer of a material and wherein the projecting feature has a main surface density (Dsp), the process comprising:

calculating a main equivalent thickness (Hea) by multiplying the main surface density (Dsp) of the projecting feature by the thickness (Hi) of the projecting feature;

polishing, under the defined polishing conditions, a reference wafer comprising an external layer of reference material, having a uniform thickness and covering the surface of this reference wafer, so as to determine the rate of removal (V) by the polishing machine corresponding to the ratio of the thickness removed (Hr) to the polishing time elapsed (Tr);

calculating a polishing time (Tp) which is equal to the ratio of the equivalent thickness (Hea) to rate of removal (V); and carrying out, under the polishing conditions, a polishing operation on at least one wafer to be polished for a duration that depends on the polishing time (Tp).

A process for polishing the external surface of at least one wafer of integrated circuits comprising a projecting feature covered over the entire surface of the wafer with an external layer of a material. The process, which is performed on a polishing machine and under defined polishing conditions, may comprise the following steps according to the invention: calculating a main equivalent thickness equal to the main surface density of the projecting feature multiplied by the thickness of the latter. The process can further include a step of polishing, under the defined polishing conditions, a reference wafer comprising an external layer of the material, which has a uniform thickness and covers the surface of this reference wafer, so as to determine the rate of removal by the polishing machine corresponding to the ratio of the thickness removed to the polishing time elapsed. A polishing time is calculated which is equal to the ratio of the aforementioned equivalent thickness to the aforementioned rate of removal; and in carrying out, under the polishing conditions, the polishing operation on at least one wafer to be polished for a duration which is equal to the aforementioned polishing time or which depends on this time.

Another possible process according to the invention may comprise: calculating a total equivalent thickness equal to the sum of the main equivalent thickness and of a complementary thickness of preset value; calculating a polishing time equal to the ratio of this total equivalent thickness to the aforementioned rate of removal; and carrying out, under the polishing conditions, the polishing operation on at least one wafer to be polished for a duration which is equal to this aforementioned polishing time or which depends on this time.

Another possible process according to the invention may comprise: measuring the remaining thickness, after polishing the covering material, on at least one polished wafer; subtracting this measured thickness from the desired thickness in order to obtain a correction thickness; calculating a total equivalent thickness equal to the sum of the correction thickness and of the equivalent thicknesses; calculating a polishing time equal to the ratio of this total equivalent thickness to the rate of removal; and carrying out, under the polishing conditions, the polishing operation on at least one wafer to be polished for a duration which is equal to this polishing time or which depends on this time.

According to one aspect of the invention, the complementary thickness is preferably obtained by measuring the thickness of the covering material between the projecting parts of the feature and by subtracting from this thickness the thickness of this feature and the desired thickness which has to remain above this feature.

According to another possible implementation of the invention, the complementary thickness is preferably obtained by measuring the thickness of the covering material above the projecting feature and by subtracting from this thickness the thickness of the projecting feature.

DETAILED DESCRIPTION OF PREFERRED EMBODIMENTS

Preferred embodiments of the present invention will be described in detail hereinbelow with reference to the attached drawings. The present invention will be more clearly understood on studying a process for the chemical-mechanical polishing of wafers of integrated circuits as described below.

Figure 1:
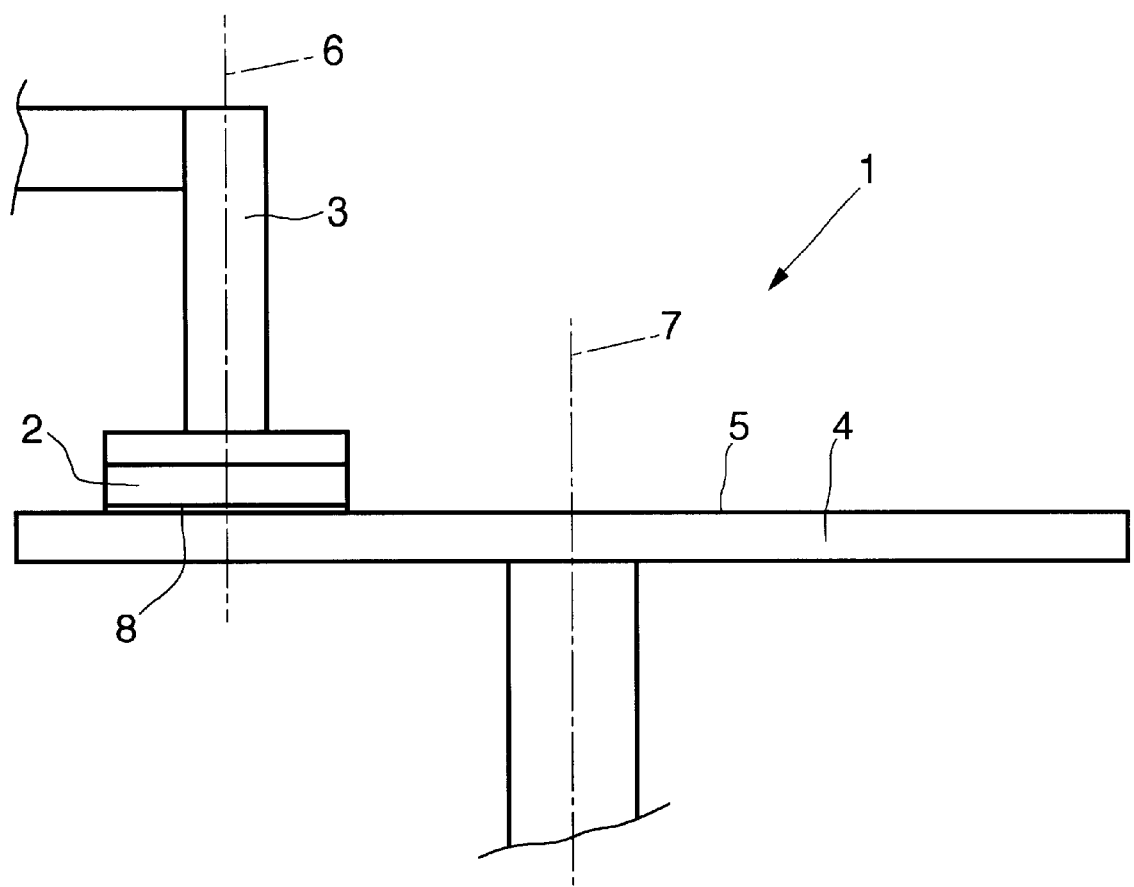
FIG. 1 shows diagrammatically an external elevation of a particular polishing machine on which a polishing process according to the present invention may be carried out.

Referring to FIG. 1, there is shown diagrammatically, a polishing machine 1 which comprises a rotary head 2 which is carried by an arm 3 of a movement system (not shown) and which is connected to a rotational drive system (not shown), as well as a turntable 4 which is connected to a rotational drive system (not shown) and which carries on its radial surface 5 a polishing cloth.

The vertical axis 6 of the rotary head 2 is offset with respect to the vertical axis 7 of the polishing turntable 4 and the rotary head 2 extends only over a part lying between the axis and the peripheral edge of the turntable 4.

The rotary head 2 carries a wafer 8 of integrated circuits to be polished and presses down this wafer 8 onto the polishing cloth 5 of the turntable 4 in a defined and constant manner.

Since the head 2 and the turntable 4 are rotationally driven, respectively, an abrasive component put on the polishing cloth 5 allows chemical-mechanical polishing of the surface of the wafer 8 facing the turntable 4 to be carried out.

Of course, the polishing machine 1 could have several polishing heads 2 distributed over the surface 5 of the turntable 4 so as to polish several wafers 8 simultaneously.

Figure 2:
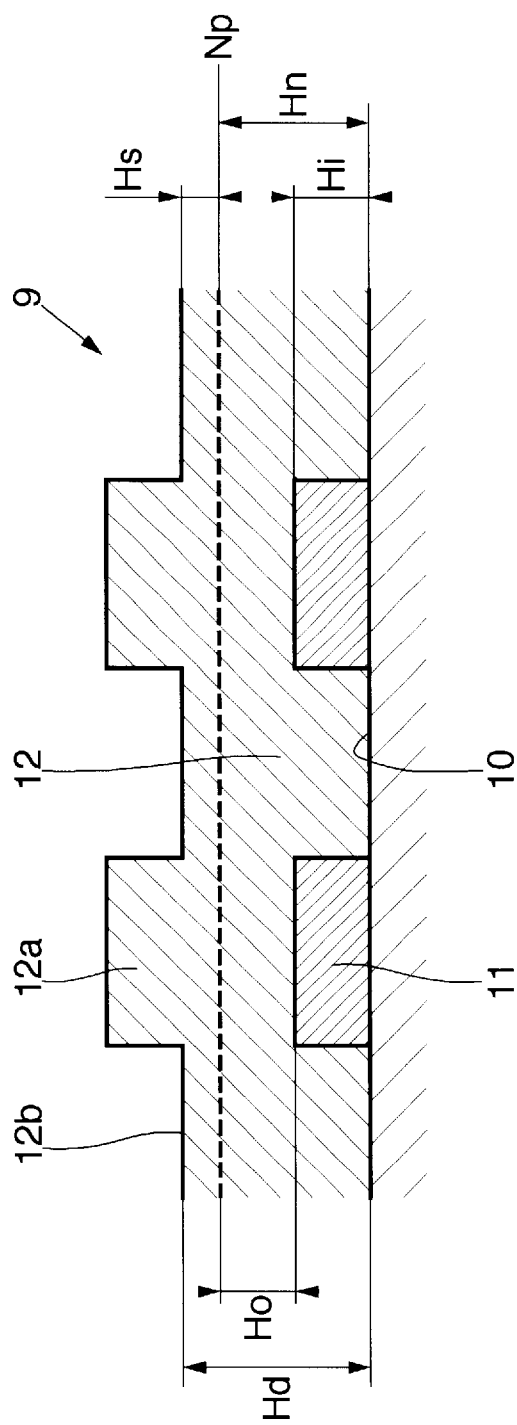
FIG. 2 shows a cross section of a wafer of integrated circuits having to undergo a polishing operation.

Referring to FIG. 2, this shows a first wafer 9 in the course of fabrication, which comprises, on a front base surface 10, a crenel-shaped projecting metal feature 11 of thickness Hi, obtained for example by etching, covered with an oxide layer 12 over the entire surface of the wafer 9, this oxide layer 12 having projecting parts 12a formed above the feature 11 and of corresponding shape.

The wafer 9 thus produced must undergo an operation in which the covering layer 12 is polished so as to obtain a polished flat surface lying at a level Np, a distance Ho from the upper surface of the projecting feature 11. Thus, the polishing operation must remove the projecting parts 12a and a complementary thickness Hs over the entire surface of the wafer 9.

On such a wafer 9, the thickness Hd of the layer 12, between its surface 12b extending between its projecting parts 12a and the base surface 10, may in particular be measured, for example by reflectometry. Thus, Hs=Hd−Hi−Ho.

Figure 3:
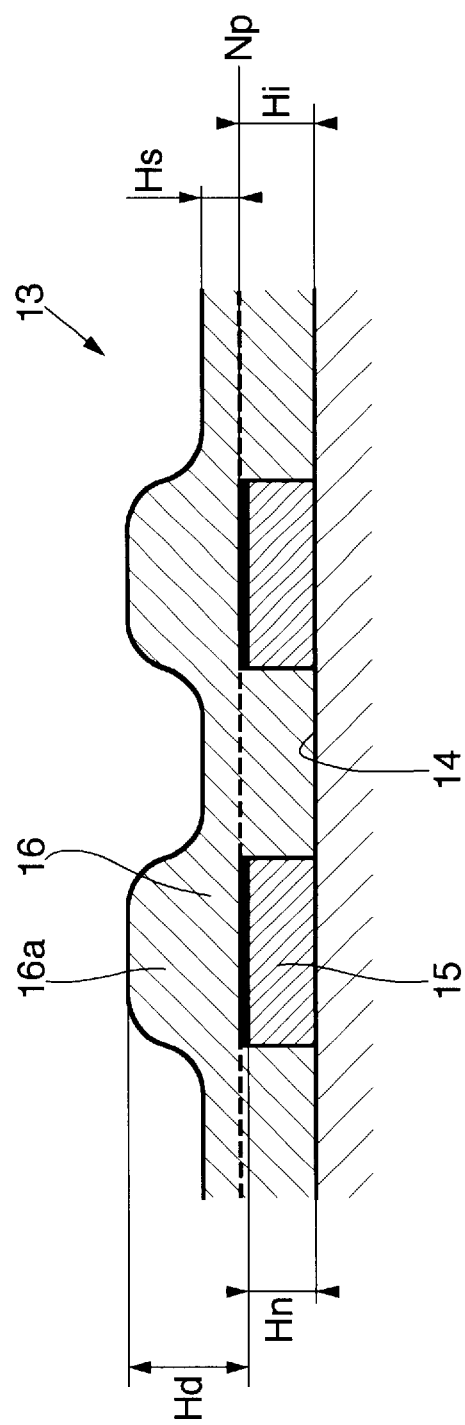
FIG. 3 shows a cross section of another wafer requiring a polishing operation.

Referring to FIG. 3, this shows a second wafer 13 in the course of fabrication, this having a front base surface 14 on which a crenel-shaped projecting oxide feature 15 of thickness Hi is formed, this feature being covered over the entire surface of the wafer 13 with a metal layer 16 which has, above the projecting feature 15, projecting parts 16a of corresponding shape, these being rounded in their corners.

The wafer 13 thus produced must undergo an operation in which the covering layer 16 is polished so as to obtain a flat external surface lying at a level Np which extends level with the end surface of the projecting feature 15 so as to expose the end surfaces of this feature 15. Thus, the polishing operation must remove the projecting parts 16a and a complementary thickness Hs over the entire surface of the wafer 13.

On this wafer 13, the thickness Hd of the layer 16, between the end surface of the projecting parts 16a and the end surface of the projecting feature 15, may in particular be measured, for example by capacitive measurement. Thus, Hs=Hd−Hn, the thickness to be reached, Ho, being equal to the thickness Hi.

A process which allows batches of wafers 9 or 13 to be polished on the polishing machine 1, under defined operating conditions so as to attain polished external surfaces lying at the aforementioned levels Np, will now be described with reference to FIGS. 4 to 6, and in particular with reference to the diagram 100 in FIG. 6.

These operating conditions are determined mainly by a particular speed of rotation of the head 2, a particular speed of rotation of the turntable 4, a particular abrasive component used and the pressure, generated by the head 2, of the wafer on the turntable 7.

In general, the process consists, under these particular operating conditions, in determining a polishing time Tp for the wafers on the polishing machine 1, this polishing time being determined depending on a calculated equivalent thickness and on a rate of removal V by the polishing machine 1.

Figure 4:
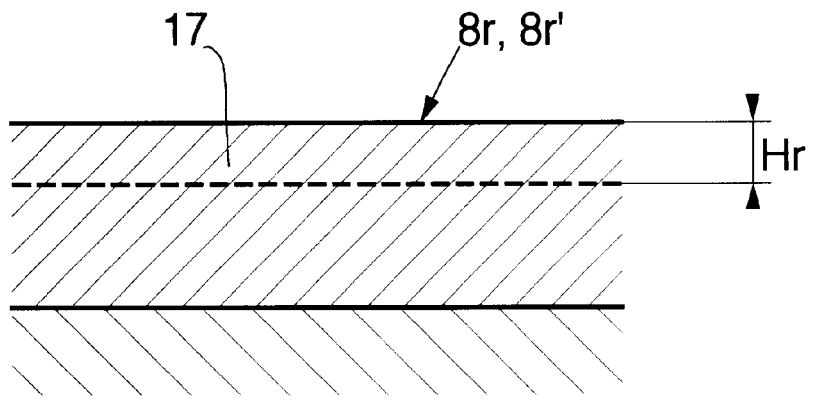
FIG. 4 shows a cross section of a reference wafer.

To do this, as shown in FIG. 4, reference wafers $8r$ or $8r'$ are used which comprise, over their entire surface, a uniform layer 17 of oxide 12 or metal respectively, these being identical to the oxide or to the metal of the batches of wafers to be polished.

The wafers $8r$ or $8r'$ are polished, under the aforementioned defined operating conditions, for a defined reference duration Tr and the thickness Hr of material removed is measured by any known means.

In step 101 of the process, the rate of removal V of the oxide 12 or of the metal by the polishing machine 1 is calculated. This rate of removal V is equal to the ratio of the thickness removed Hr to the time Tr namely V=Hr/Tr.

EXAMPLE 1

From the mask which served for producing the projecting features 11 or 15 on the wafers 9 or 13, the surface density Dsp of these features is determined. This density is equal to the ratio of the volume occupied by the projecting features 11 or 15 to the total volume of the wafers 9 or 13.

Knowing the thickness Hi of the projecting features 11 or 15, the product of this density Dsp and the thickness Hi is calculated, in a step 102 of the process, so as to obtain a main equivalent thickness Hea, namely Hea=DspHi.

In a step 103 of the process, the complementary thicknesses Hs of material to be removed are set so as to obtain the aforementioned levels Np, thus setting a complementary equivalent thickness, namely Heb=Hs.

In a step 104 of the process, a total equivalent thickness He1 is calculated by adding the equivalent thickness Hea to the complementary thickness Heb and this total equivalent thickness He1 is divided by the rate of removal V. A calculated polishing time Tp1 is thus obtained, namely Tp1=(Hea+Heb)/V.

This polishing time Tp1 is then input into the automatic device 18 for stopping and starting the polishing machine 1.

The polishing of the corresponding batch of wafers 9 or 13 to be polished on the polishing machine 1 may then be carried out by making the machine operate for a duration equal to the calculated polishing time Tp and under the aforementioned defined operating conditions.

When a batch has been polished, the operations and calculations described above may be restarted so as to obtain a new polishing time Tp for a new batch of wafers.

EXAMPLE 2

In order to further improve the determination of the polishing time Tp for a batch of wafers, so as to position the levels Np more accurately, correction factors may be introduced.

During the operations of polishing the wafers of a batch of wafers to be polished, the thickness Hn of the layer remaining on a polished specimen wafer may be measured. If this thickness Hn is different from the desired thickness Ho, their difference is calculated in a step 105 of the process so as to obtain a correction thickness Hec, namely Hec=Hn−Ho.

Step 104 of the process then consists in calculating a total equivalent thickness He2 by adding the thicknesses Hea, Heb and Hec together and by dividing this total equivalent thickness He2 by the rate of removal V, so as to obtain a polishing time Tp2, namely Tp2=(Hea+Heb+Hec)/V.

This corrected polishing time Tp2 is then input into the control device 18 of the polishing machine 1 so as to polish the subsequent wafers of the batch for a duration equal to this new time Tp2.

EXAMPLE 3

Figure 5:
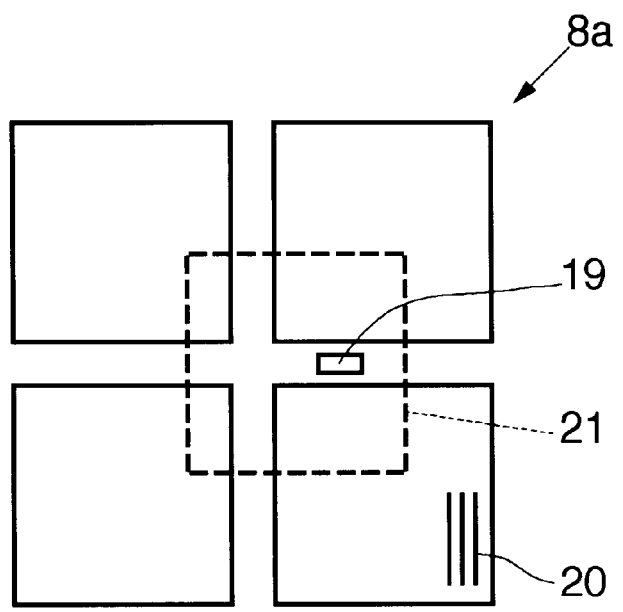
FIG. 5 shows a partial top view of a wafer of integrated circuits having to undergo a polishing operation.
Figure 6:
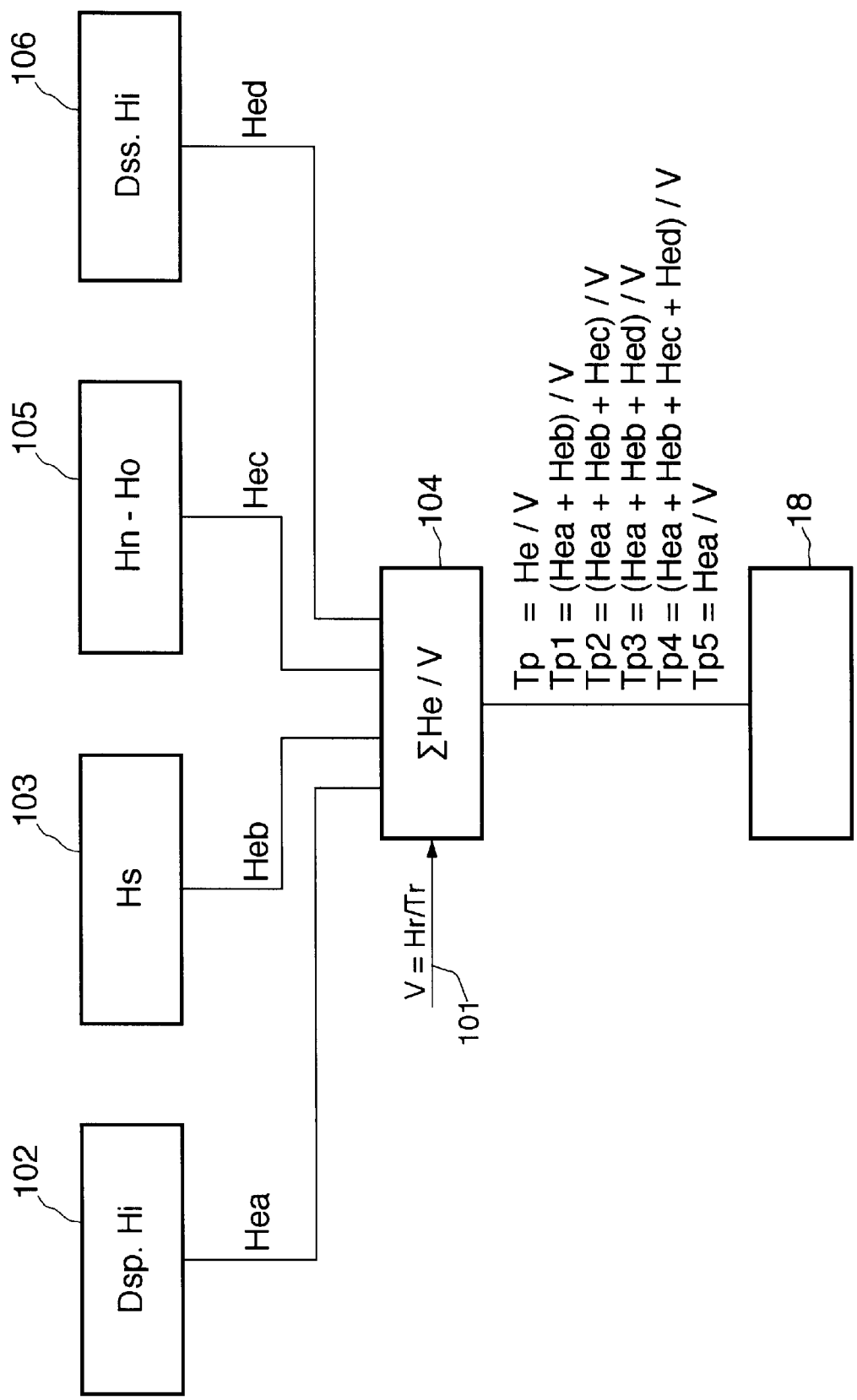
FIG. 6 shows a schematic diagram of the polishing process according to the present invention.

In the case of certain wafers 8a shown in FIG. 5, a feature may be provided which comprises thickness-measurement projections 19, the end surface of which has a width and a length that are significantly greater than the width of the projecting lines 20 formed by the projecting features 11 and 15 produced on the wafers 9 and 13.

It is then advantageous to define a region 21 which includes the measurement projection 21 and which partly covers the four regions corresponding to the four integrated circuits adjacent to this measurement projection 21.

From the mask corresponding to the feature, the secondary surface density Dss of the feature in the region 21, which is equal to the ratio of the area of the feature in this region to the area of this region, is determined.

In a step 106 of the process, the product of this density Dss and the height Hi of the feature is calculated so as to obtain a correction thickness Hed, namely Hed=DssHi.

Step 104 of the process then consists in calculating a total equivalent thickness He3 by adding the thicknesses Hea, Heb and Hed together and by dividing this total equivalent thickness He3 by the rate of removal V so as to obtain a polishing time Tp3, namely Tp3=(Hea+Heb+Hed)/V.

This polishing time Tp3 is then input into the control device 18 of the polishing machine 1 and the wafers to be polished of the batch to which this polishing time Tp3 applies are polished.

EXAMPLE 4

According to a complementary variant, taking into account thickness measurements on specimen wafers during operations in which the wafers of a batch are polished, and combining the aforementioned calculations, it is possible to define a polishing time Tp4 equal to the ratio of a total equivalent thickness He4, resulting from adding the aforementioned equivalent thicknesses Hea, Heb, Hec and Hed together, to the rate of removal V, namely Tp4=(Hea+Heb+Hec+Hed)/V.

The polishing time may therefore be advantageously varied during the operations of polishing a batch of wafers to be polished.

EXAMPLE 5

According to a simplified variant, the polishing operation could consist in making only the projecting parts 12a and 16a of the wafers 9 or 13 disappear.

In this case, the calculated polishing time Tp5 would be equal to the ratio of the main equivalent thickness Hea to the rate of removal V, namely Tp5=Hea/V, and this time would be applied to the polishing machine 1.

What is claimed is:

1. A process for polishing, on a polishing machine and under defined polishing conditions, of an external surface of at least one wafer of integrated circuits using a reference wafer, the wafer of integrated circuits being of the type that includes at least one projecting feature that is covered over the entire surface of the wafer with an external layer of a material, and the reference wafer being of the type that includes an external layer of material having a uniform thickness and covering the surface of the reference wafer, the projecting feature having a main surface density (Dsp), and a thickness (Hi) the process comprising the steps of:

calculating a main equivalent thickness (Hea) for the wafer of integrated circuits by multiplying the main surface density (Dsp) of the projecting feature by the thickness (Hi) of the projecting feature;

polishing, under the defined polishing conditions, the reference wafer so as to determine a rate of removal (V) by the polishing machine corresponding to a ratio of a thickness removed (Hr) to a polishing time elapsed (Tr);

calculating a polishing time (Tp) which is equal to the ratio of the main equivalent thickness (Hea) for the wafer of integrated circuits to the rate of removal (V) by the polishing machine; and carrying out, under the defined polishing conditions, a polishing operation on the wafer of integrated circuits for a duration that depends on the polishing time (Tp).

2. The process according to claim 1, wherein the polishing operation is performed for a duration which is equal to the polishing time.

3. The process of claim 1, further comprising:

measuring a remaining thickness (Hn), after polishing the wafer of integrated circuits;

using the remaining thickness (Hn) and a desired thickness (Ho) in order to calculate a correction thickness (Hec);

calculating a total equivalent thickness (He2) equal to the sum of the correction thickness (Hec) and the main equivalent thicknesses (Hea);

calculating a polishing time (Tp2) equal to the ratio of the total equivalent thickness (He2) to the rate of removal (V); and carrying out, under the defined polishing conditions, the polishing operation on another wafer of integrated circuits for a duration which depends on the polishing time (Tp2).

4. The process of claim 3, wherein the polishing operation is performed for a duration which is equal to the polishing time.

5. The process of claim 1, wherein in the step of calculating a polishing time, the polishing time is made equal to the ratio of the main equivalent thickness of the wafer of integrated circuits plus a predetermined complementary thickness (Hea+Heb) to the rate of removal (V) by the polishing machine, and the complementary thickness is obtained by measuring the thickness of the covering material above the projecting feature and by subtracting from this thickness the thickness of the projecting feature.

6. The process according to claim 5, wherein the polishing operation is performed for a duration which is equal to the polishing time.

7. The process of claim 1, wherein in the step of calculating a polishing time, the polishing time is made equal to the ratio of the main equivalent thickness of the wafer of integrated circuits plus a predetermined complementary thickness (Hea+Heb) to the rate of removal (V) by the polishing machine, and the complementary thickness is obtained by measuring a thickness of the covering material between the projecting parts of the feature and by subtracting from this thickness the thickness of this feature (11) and the desired thickness which has to remain above this feature.

* * * * *